(12) United States Patent
Bhattacharya et al.

(10) Patent No.: US 7,786,799 B2
(45) Date of Patent: Aug. 31, 2010

(54) TRIMMING TECHNIQUE FOR HIGH VOLTAGE AMPLIFIERS USING FLOATING LOW VOLTAGE STRUCTURES

(75) Inventors: Anindya Bhattacharya, Tucson, AZ (US); David F. Cox, Tucson, AZ (US)

(73) Assignee: Cirrus Logic, Inc., Austin, TX (US)

( * ) Notice: Subject to any disclaimer, the term of this patent is extended or adjusted under 35 U.S.C. 154(b) by 274 days.

(21) Appl. No.: 12/053,534

(22) Filed: Mar. 21, 2008

(65) Prior Publication Data

US 2009/0237163 A1 Sep. 24, 2009

(51) Int. Cl.
*H03F 3/45* (2006.01)
(52) U.S. Cl. .................. 330/253; 330/264
(58) Field of Classification Search ............ 330/253, 330/255, 257, 264, 261
See application file for complete search history.

(56) References Cited

U.S. PATENT DOCUMENTS

| | | | | |
|---|---|---|---|---|
| 3,823,330 | A | * 7/1974 | Rapp | 326/72 |
| 4,000,474 | A | * 12/1976 | Todokoro | 330/264 |
| 4,483,016 | A | * 11/1984 | Hochstein et al. | 381/120 |
| 4,973,916 | A | * 11/1990 | Baik | 330/255 |
| 5,302,917 | A | * 4/1994 | Concorso | 330/264 |
| 5,389,892 | A | 2/1995 | Embree | |
| 5,677,647 | A | * 10/1997 | Knierim | 330/263 |
| 7,064,609 | B1 | 6/2006 | Beck et al. | |

* cited by examiner

*Primary Examiner*—Henry K Choe
(74) *Attorney, Agent, or Firm*—Hayes Soloway P.C.

(57) ABSTRACT

The system contains a first MOS transistor having a first source element, a first drain element, and a first gate element. A first low voltage current source has two ends. The ends of the low voltage current source are connected to at least two of the first MOS transistor elements. At least one first Zener clamp is in parallel with the low voltage current source.

19 Claims, 5 Drawing Sheets

1

TRIMMING TECHNIQUE FOR HIGH VOLTAGE AMPLIFIERS USING FLOATING LOW VOLTAGE STRUCTURES

FIELD OF THE INVENTION

The present invention is generally related to high voltage amplifiers and more particularly is related to matching transistors in high voltage amplifiers.

BACKGROUND OF THE INVENTION

Significant challenges are posed when designing precision analog circuits with DMOS (Double-Diffused Metal Oxide Semiconductor) transistors having greater than 100V breakdown voltage. These devices may use thicker gate oxides, which make matching difficult (and mismatches cause problems as discussed herein). In order to achieve high VDS (wherein VDS is the voltage difference between the transistor drain and source) breakdowns and reduce the effects of high electric fields, these devices have predefined layouts that may be circular or orthogonal. As a result, common layout techniques for matching of MOS transistors may not be employed for their high voltage counterparts. The high voltage devices are usually not scalable, and thus optimizing device sizes for better matching is a challenge.

Mismatches among transistors can result in a variety of imperfections in analog circuits. In operational amplifiers, differential amplifiers, and operational transconductance amplifiers, mismatching typically causes input referred offset voltages that drift with temperature. Mismatches between DMOS transistors may cause input offset voltages as high as 25 mV and offset drifts of over 60 uV/° C. Mismatches between output buffer circuits and the previous gain stages in operational amplifiers can cause higher than expected quiescent current. In dual gain cross-coupled differential amplifier stages, two active load mismatches in the current mirrors can cause the bias current in the differential amplifier to drop to zero. In recent years, there has been a growing demand for high voltage analog integrated circuits, particularly in the field of test and measurement. In order to meet the high voltage and precision requirements at the same time, new design techniques are required.

Trimming may be employed to reduce effects such as offset voltage, temperature drift, and excessive quiescent current. FIG. 1 is an illustration of a schematic diagram illustrating trimming techniques for amplifiers as known in the prior art. FIG. 1 shows a standard operational transconductance amplifier 10 with various common trimming options. The operational transconductance amplifier 10 may be used in a front end of an operational amplifier.

FIG. 1 shows three different trim networks applied symmetrically for the operational transconductance amplifier 10. The first trim network 12 adjusts the sizes of the input transistors 14. The second trim network 16 uses one or more source resistors 18 to trim an offset. The third trim network 20 adjusts current source loads for trimming. It should be noted that the trim networks 12, 16, and 20 include elements that are inherent to the operational transconductance amplifier 10. The switches shown in FIG. 1 can be implemented using Zener zaps, poly or metal fuses, CMOS switches, or other similar devices as known to those having ordinary skill in the art.

For a high voltage operational transconductance amplifier 10, each of the aforementioned trim networks 12, 16, 20 is flawed. More specifically, the first trim network 12 uses fractional input transistors 14 for adjusting offset. Since high voltage devices may not be scalable and may occupy substantial die area and increase the input capacitance of the amplifier, the first trim network 12 is not a desirable option. The second trim network 16 uses resistors 18, which typically consume substantial die area. Furthermore, the drop across the resistor 18 reduces a negative swing of the operational transconductance amplifier 10. The third trim network 20 has flaws that are similar to the first trim network 12. Thus, none of the traditional trimming methods for the operational transconductance amplifier 10 are viable options for high voltage amplifier mismatch adjustment. A matching method and apparatus that are scalable and consume limited die area are desirable.

Thus, a need exists in the industry to address the aforementioned deficiencies and inadequacies.

SUMMARY OF THE INVENTION

Embodiments of the present invention provide a system and method for trimming high voltage amplifiers. Briefly described, in architecture, one embodiment of the system, among others, can be implemented as follows. The system contains a first high-voltage MOS transistor having a first source element, a first drain element, and a first gate element. A first low voltage current source has two ends. The ends of the low voltage current source are connected to at least two of the first MOS transistor elements. At least one first Zener clamp is connected between two of the first MOS transistor elements.

The present invention can also be viewed as providing methods for providing a method for trimming at least one amplifier. In this regard, one embodiment of such a method, among others, can be broadly summarized by the following steps: arranging a first MOS transistor having a first source element, a first drain element, and a first gate element and a first low voltage current source having two ends, such that the ends are connected to two of the first MOS transistor elements; arranging at least one first Zener clamp between two of the first MOS transistor elements; and manipulating the current source to alter a current across the first MOS.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
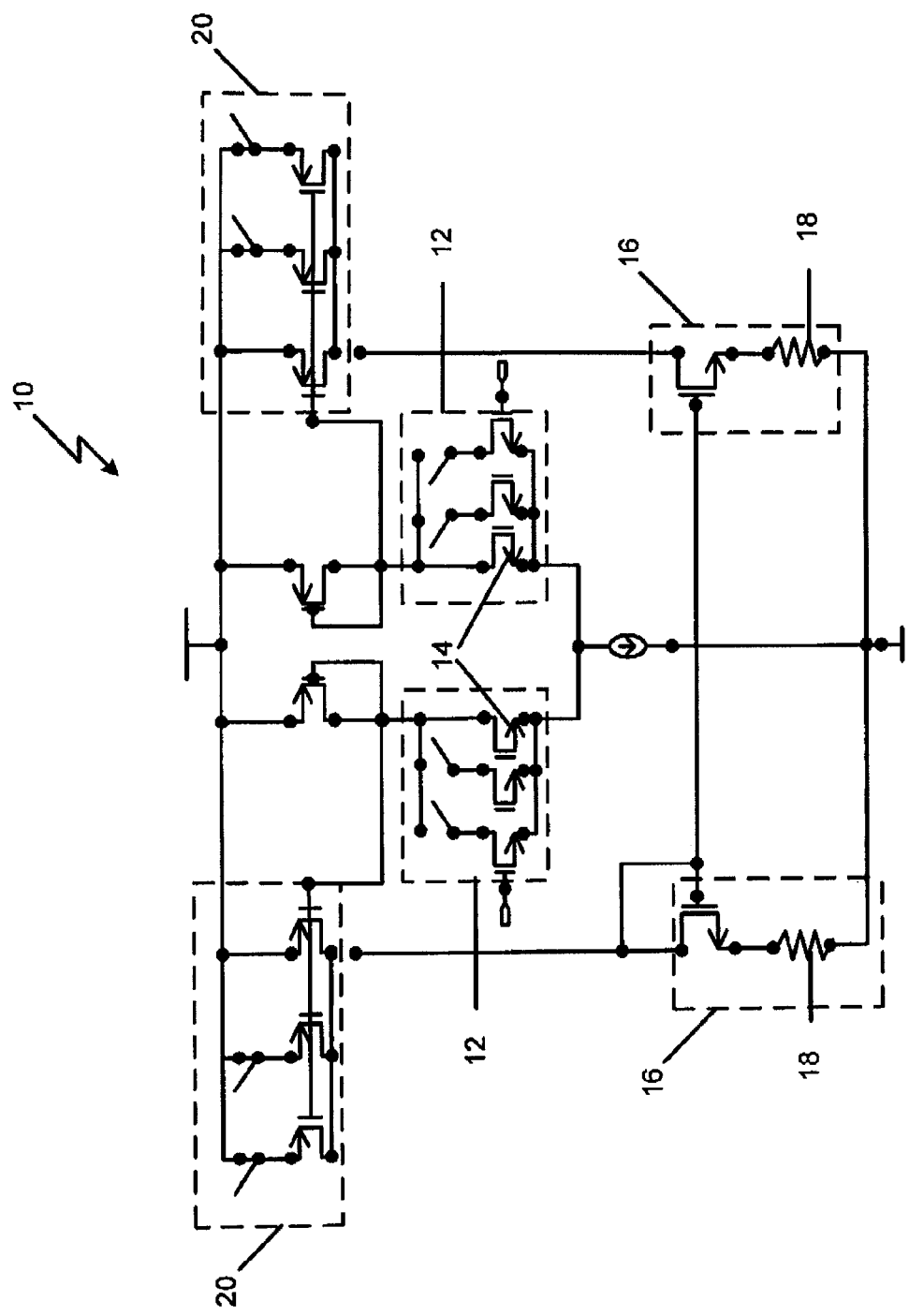
FIG. 1 is an illustration of a schematic diagram illustrating trimming techniques for amplifiers as known in the prior art.
Figure 2:
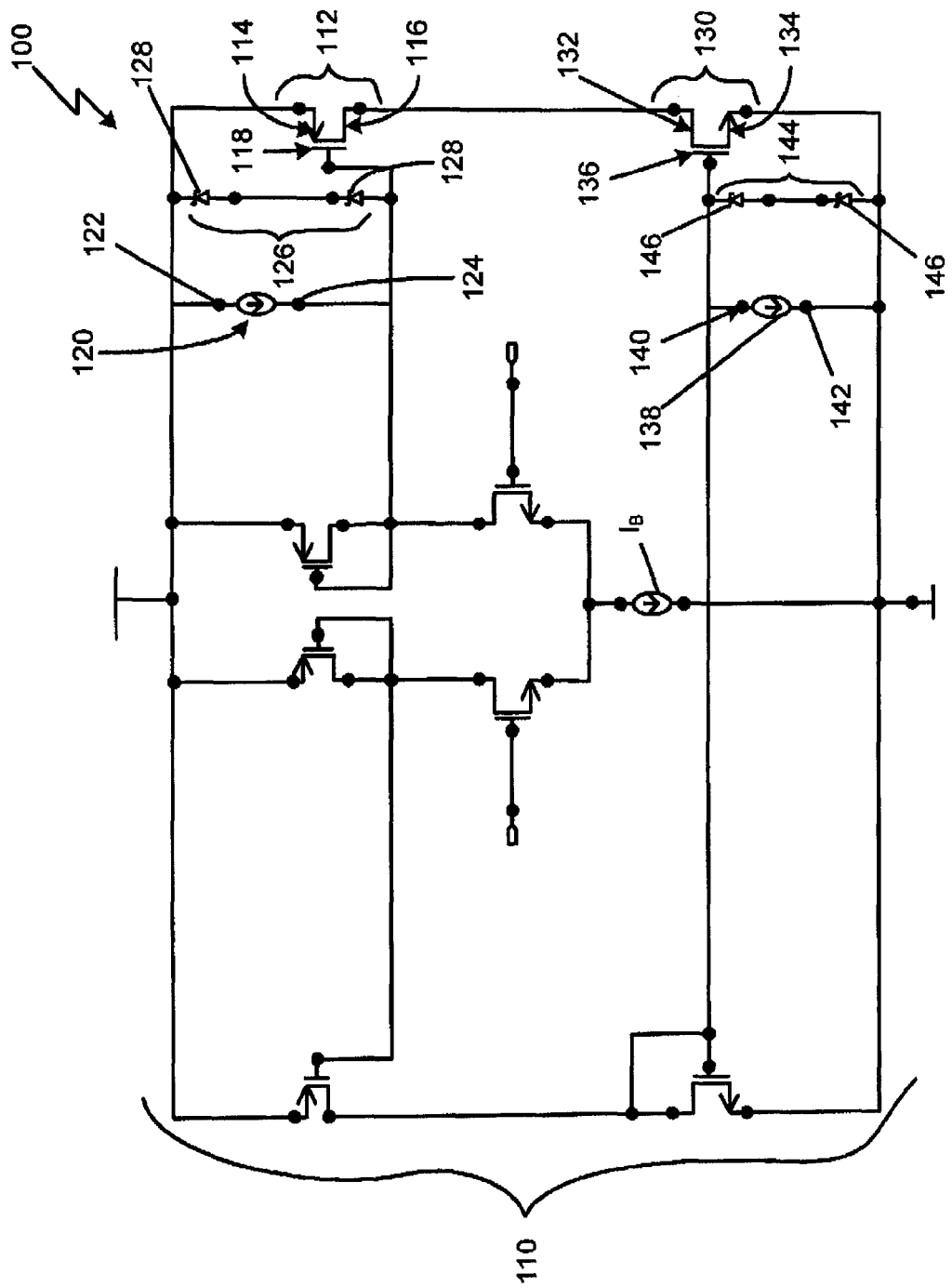
FIG. 2 is an illustration of a schematic diagram illustrating a system for trimming high voltage amplifiers, in accordance with a first exemplary embodiment of the present invention.

FIG. 2 is an illustration of a schematic diagram illustrating a system 100 for trimming high voltage amplifiers 110, in accordance with a first exemplary embodiment of the present invention. The system 100 contains a first MOS transistor 112 having a first source element 114, a first drain element 116, and a first gate element 118. A first low voltage current source 120 has two ends 122, 124. The ends 122, 124 of the low voltage current source 120 are connected between two of the first MOS transistor elements 114, 116, 118. At least one first Zener clamp 126 is connected between two of the first MOS transistor elements 114, 116, 118.

The present technique may be used for trimming a high voltage operational transconductance amplifier 110. The current source 120 may include one or more low voltage CMOS devices, which consumes less die area in comparison with high voltage MOS devices. The low voltage CMOS device(s) may float to a high voltage above and below ground. Source breakdown voltage of high voltage DMOS devices, for the sake of comparison, is between six (6) and more than six hundred (600) volts. The current source 120 may be connected between the first source element 114 and the first gate element 118. The present invention may also be operable if the current source 120 is connected in series with the first MOS transistor 112 through either the first source element 114 or the first drain element 116

While the first MOS transistor 112 is part of the system 100 for trimming high voltage amplifiers 110, it should be noted that the first MOS transistor 112 may also be a requisite element of the high voltage amplifier 110. The first MOS transistor 112 may be a high voltage MOS transistor. High voltage MOS transistors may include all MOS transistors operative at greater than five volts. High voltage MOS transistors may include all MOS transistors operative at greater than one hundred volts. The first MOS transistor 112 may be a PMOS transistor.

The Zener clamp 126 may be used to keep voltages for the first gate element 118 and the first source element 114 from exceeding a breakdown voltage. If the Zener clamp 126 includes two Zener diodes 128, as shown in the first exemplary embodiment, and the voltage across each of the Zener diodes 128 is five volts, the floating trim structure will not materially exceed ten volts during operation. Under quiescent conditions, if a current of the first low voltage current source 120 is decreased, a voltage over the first MOS transistor 112 increases, thereby increasing a current through the first MOS transistor 112. For a complete operational amplifier, increasing the current through the first MOS transistor 112 would translate to a decrease in an output offset of the operational amplifier.

While the first exemplary embodiment of the Zener clamp 126 includes two Zener diodes 128, other devices may be used that provide electrical properties similar to the Zener clamp 126 as described herein, and all such other devices known to those having ordinary skill in the art are considered to be within the scope of the present invention. The Zener clamp 126 may also include more or fewer Zener diodes 128 than the number shown in FIG. 2. The Zener clamp 126 is connected between the first source element 114 and the first gate element 118 in the first exemplary embodiment. The Zener clamp 126 may limit the voltage difference between the first source element 114 and the first gate element 118.

As shown in FIG. 2, the system 100 may also include a second MOS transistor 130 having a second drain element 132, a second source element 134, and a second gate element 136. The second MOS transistor 130 is connected to the first MOS transistor 112. A second low voltage current source 138 has two ends 140, 142. The ends 140, 142 are connected between at least two of the second MOS transistor elements 132, 134, 136. At least one second Zener clamp 144 is connected between at least two of the second MOS transistor elements 132, 134, 136.

The present technique may be used for trimming a high voltage operational transconductance amplifier 110. The second current source 138 may include one or more low voltage CMOS devices, which consume less die area in comparison with high voltage MOS devices. The low voltage CMOS device may float to a high voltage above and below ground.

The Zener clamp 144 may be used to keep voltages for the first gate element 136 and the first source element 132 from exceeding a breakdown voltage. If the second Zener clamp 144 includes two Zener diodes 146, as shown in the first exemplary embodiment, and each of the Zener diodes 146 is five volts, the floating trim structure will not materially exceed 10 volts during operation. Under quiescent conditions, if a current of the second low voltage current source 138 is decreased, a voltage over the second MOS transistor 130 increases, thereby increasing a current through the second MOS transistor 130. For a complete operational amplifier, increasing the current through the second MOS transistor 130 would translate to an increase in an output offset of the operational amplifier.

As shown in the first exemplary embodiment, the second low voltage current source 138 is not connected to the first MOS transistor 112 and the first low voltage current source 120 is not connected to the second MOS transistor 130. Further, the first MOS transistor 112 and the second MOS transistor 130 may be substantially imperfectly matched, as described in the Background, without suffering the consequences described therein.

As mentioned above, under quiescent conditions, if a current of the first low voltage current source 120 is increased, a voltage over the first MOS transistor 112 decreases and if a current of the second low voltage current source 138 is increased, a voltage over the second MOS transistor 130 decreases. If the current through the first MOS transistor 112 decreases $I_{TN}$, a current value for the first low voltage current source 120, and the current through the second MOS transistor 130 decreases $I_{TP}$, a current value for the second low voltage current source 138, and an output of the operational transconductance amplifier 110 has a multiplying factor K, then the difference between the currents through the first MOS transistor 112 and the second MOS transistor 130 under DC bias conditions would be given by:

$$\Delta I = K^*(I_{TP} - I_{TN})$$

By trimming $I_{TP}$ or $I_{TN}$, the $\Delta I$ can be made more positive or negative, which would translate to bidirectional adjustment of the output of the operational transconductance amplifier 110.

Offset voltage drift can be trimmed by reducing the difference between $\Delta I$ at room temperature [$\Delta I(T_0)$] and $\Delta I$ at a higher temperature [$\Delta I(T_1)$]. FIG. 2 shows an amplifier current source $I_B$. The following equations assume that $I_B$, $I_{TP}$, and $I_{TN}$ have the same linear temperature coefficient, "$\alpha$".

$$\Delta I(T_0) = K*(I_{TP0} - I_{TN0})$$

$$\Delta I(T_1) = K*(I_{TP0}*(1+\alpha*(T_1-T_0)) - I_{TN0}*(1+\alpha*(T_1-T_0)))$$

$$\Delta I(T_1) - \Delta I(T_0) = \alpha(T_1-T_0)*\Delta I(T_0)$$

The last equation above shows that reducing $\Delta I(T_0)$ (by adjusting $I_{TP}$, or $I_{TN}$) would reduce a temperature drift of offset voltage.

Offset drift trimming using low voltage floating trim structure system described above was applied to a 350 volt precision operational amplifier. The offset drift was reduced from 27 µV/° C. (before trimming) to 3 µV/° C. (after trimming).

Figure 3:
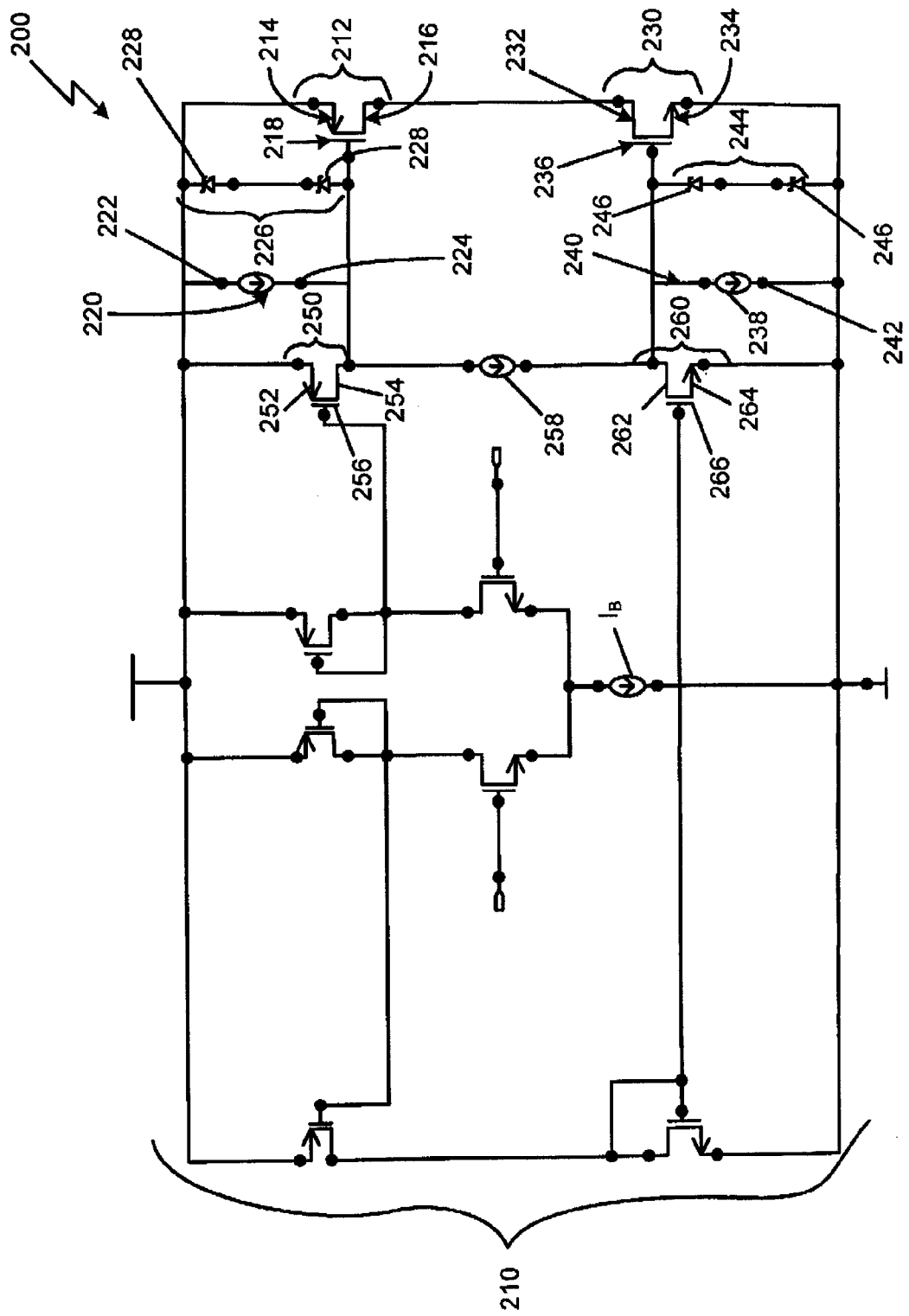
FIG. 3 is an illustration of a schematic diagram illustrating a system for trimming high voltage amplifiers, in accordance with a second exemplary embodiment of the present invention.

FIG. 3 is an illustration of a schematic diagram showing a system 200 for trimming high voltage amplifiers 210, in accordance with a second exemplary embodiment of the present invention. The system 200 contains a first MOS transistor 212 having a first source element 214, a first drain element 216, and a first gate element 218. A first low voltage current source 220 has two ends 222, 224. The ends 222, 224 of the low voltage current source 220 are connected between at least two of the first MOS transistor elements 214, 216, 218. At least one first Zener clamp 226 is connected between at least two of the first MOS transistor elements 214, 216, 218. The ends 222, 224 of the first low voltage current source 220 may be connected between the first source element 214 and the first gate element 218. The present invention may also be operable by connecting the first low voltage current source 220 in series with the first MOS transistor 212 at either the first source element 214 or the first drain element 216.

The system 200 may also include a second MOS transistor 230 having a second drain element 232, a second source element 234, and a second gate element 236. The second MOS transistor 230 is connected to the first MOS transistor 212. A second low voltage current source 238 has two ends 240, 242. The ends 240, 242 are connected between at least two of the second MOS transistor elements 232, 234, 236. At least one second Zener clamp 244 is connected between at least two of the second MOS transistor elements 232, 234, 236.

A third MOS transistor 250 has a third source element 252, a third drain element 254, and a third gate element 256. Two of the third MOS transistor elements 252, 254, 256 are connected to two of the ends 222, 224 of the first low voltage current source 220. A fourth MOS transistor 260 has a fourth source element 262, a fourth drain element 264, and a fourth gate element 266. Two of the fourth MOS transistor elements 262, 264, 266 are connected to two of the ends 240, 242 of the second low voltage current source 238. The third MOS transistor 250 and the fourth MOS transistor 260 are connected by a third current source 258.

Floating low voltage current sources 220, 238 may be used for adjusting output stage quiescent current. FIG. 3 shows a high voltage operational transconductance amplifier 210 integrated with a class AB output buffer. The first and second MOS transistors 212, 230 may be expected to have a large multiplying factor (K) in comparison with the third and fourth MOS transistors 250, 260 for high current drive capability. Thus, a slight threshold mismatch between the first and third MOS transistors 212, 250 may cause the current in the first MOS transistor 212 to increase substantially, thereby increasing the overall quiescent current. This increase may be trimmed by increasing the current through the first low voltage current source 220, which is a low voltage floating (high-side) current mirror to decrease a voltage across the third MOS transistor 250 under bias conditions, thereby reducing the overall quiescent current. On the low-side, the second low voltage current source 238 may be used to trim bias current through the fourth MOS transistor 230.

Figure 4:
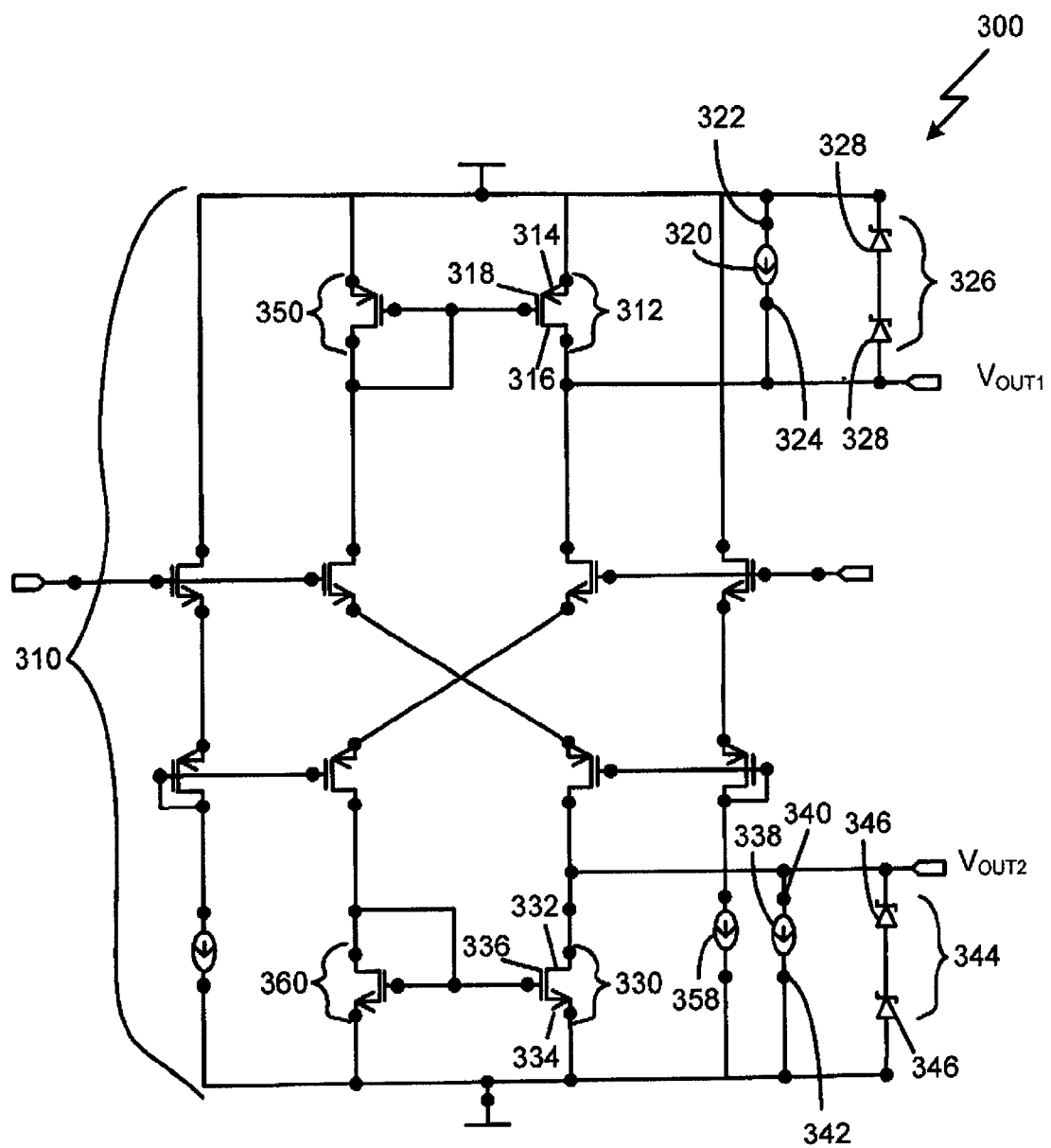
FIG. 4 is an illustration of a schematic diagram illustrating a system for trimming high voltage amplifiers, in accordance with a third exemplary embodiment of the present invention.

FIG. 4 is an illustration of a schematic diagram illustrating a system 300 for trimming high voltage amplifiers 310, in accordance with a third exemplary embodiment of the present invention. The system 300 contains a first MOS transistor 312 having a first source element 314, a first drain element 316, and a first gate element 318. A first low voltage current source 320 has two ends 322, 324. The ends 322, 324 of the low voltage current source 320 are connected between two of the first MOS transistor elements 314, 316, 318. At least one first Zener clamp 326 is connected between two of the first MOS transistor elements 314, 316, 318.

The system 300 may also include a second MOS transistor 330 having a second drain element 332, a second source element 334, and a second gate element 336. A second low voltage current source 338 has two ends 340, 342. The ends 340, 342 are connected to at least two of the second MOS transistor elements 332, 334, 336. At least one second Zener clamp 344 is connected to at least two of the second MOS transistor elements 332, 334, 336.

The third exemplary embodiment contains trimmable floating low voltage current sources 320, 338 integrated with a differential amplifier. The low voltage current sources 320, 338 can be low voltage because a maximum voltage across the low voltage current sources 320, 338 is limited by a maximum voltage breakdown on the subsequent stage transistors. In this embodiment, if a bias current through the first MOS transistor 312 may be less than a bias current through a third MOS transistor 350 because of a threshold mismatch, then the first low voltage current source 320 can be increased to compensate. Similarly, the second low voltage current source 338 can be increased to compensate for a reduced bias current in the second MOS transistor 330 as compared to a fourth MOS transistor 360. Thus, the low voltage current sources 320, 338 can improve yields for high voltage operational amplifiers utilizing the topology shown in FIG. 4. Additionally, the low voltage current sources 320, 338 can be used for bi-directional trimming for operational amplifier offset voltage to make a new generation of precision high voltage and high speed operational amplifiers without consuming large die area.

While designing the floating current sources, it is important to make output impedance across the first low voltage current source 320 greater than the output impedance of the amplifier current source 358 so that the small signal gain is not affected much. High output impedance cascode current mirrors with long channel lengths on devices would be an effective approach for designing the floating current mirrors. Furthermore, to encourage the devices in the cascode structure to operate in saturation, wide-swing biasing would be useful. Also, adding the low voltage current sources 320, 338 to the differential amplifier may have an effect on the poles caused by high impedance nodes $V_{out1}$ and $V_{out2}$. The low frequency pole on $V_{out1}$ will be lower with the first low voltage current source 320 added because of capacitance added by the first low voltage current source 320.

Figure 5:
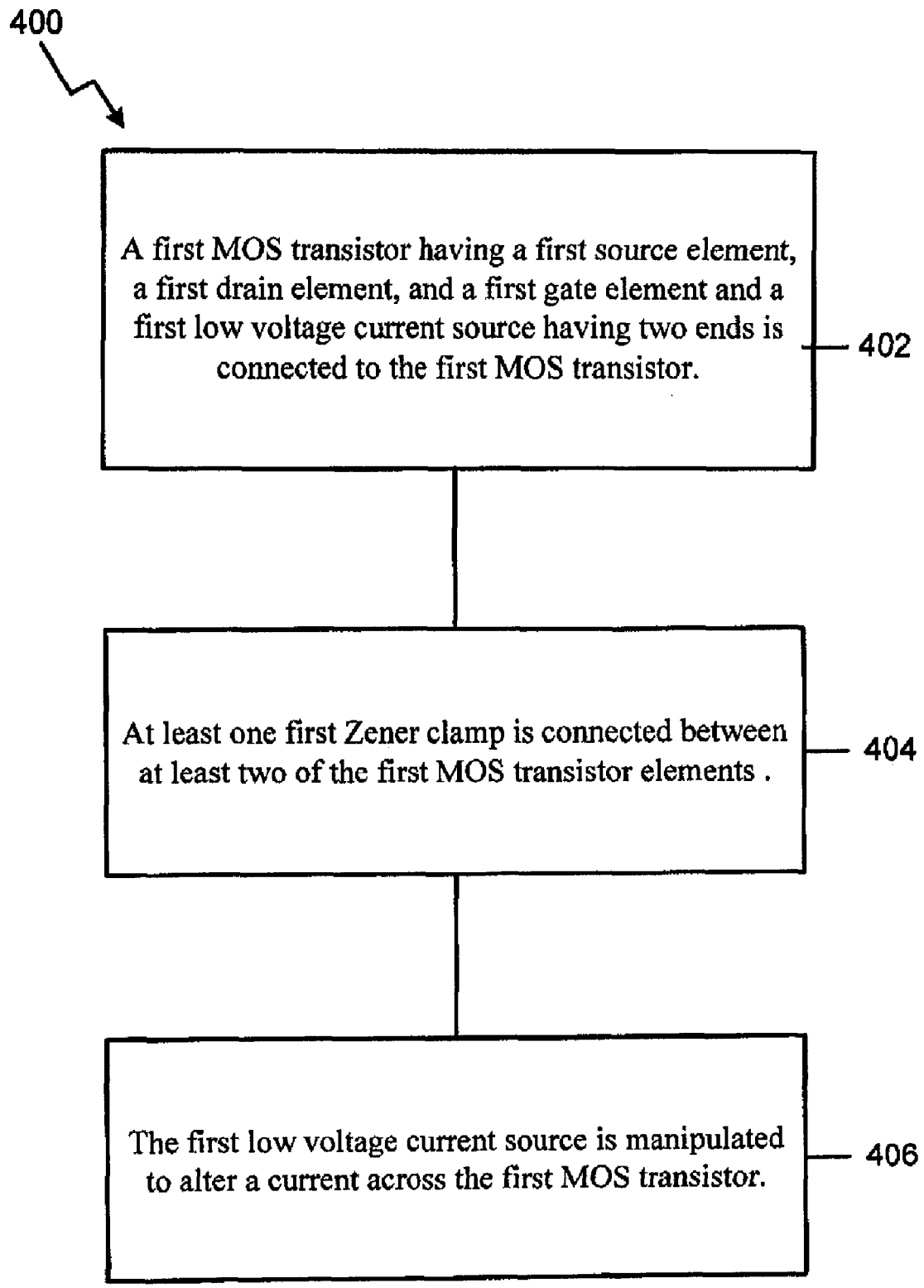
FIG. 5 is a flowchart illustrating a method of trimming an amplifier utilizing the system for trimming high voltage amplifiers shown in FIG. 1, in accordance with the first exemplary embodiment of the invention.

FIG. 5 is a flowchart 400 illustrating a method of trimming an amplifier utilizing the abovementioned system 100 for trimming high voltage amplifiers 110 in accordance with the first exemplary embodiment of the invention. It should be noted that any process descriptions, or blocks in flow charts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved, as would be understood by those reasonably skilled in the art of the present invention.

As is shown by block 402, a first MOS transistor 112 having a first source element 114, a first drain element 116, and a first gate element 118 and a first low voltage current source 120 having two ends 122, 124 is connected to the first MOS transistor 112. At least one first Zener clamp 144 is connected between at least two of the first MOS transistor elements 114, 116, 118 (block 404). The first low voltage current source 120 is manipulated to alter a current across the first MOS transistor 112 (block 406).

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A circuit system comprising at least one amplifier, the system comprising:
   a first MOS transistor having a first source element, a first drain element, and a first gate element;
   a first low voltage current source having two ends, at least one of the ends connected to at least one of the MOS transistor elements; and
   at least one first Zener clamp connected between the first gate element and at least one other of the first MOS transistor elements, wherein the first Zener clamp comprises a pair of unidirectional Zener diodes in series.

2. The system of claim 1, further comprising
   a second MOS transistor having a second source element, a second drain element, and a second gate element, the second MOS transistor connected to the first MOS transistor;
   a second low voltage current source having two ends, at least one of the second low voltage current source ends connected to at least one of the second MOS transistor elements; and
   at least one second Zener clamp connected between the second gate element and at least one other of the second MOS transistor elements.

3. The system of claim 2, wherein at least one component is connected between the second low voltage current source and the first MOS transistor and at least one component is connected between the first low voltage current source and the second MOS transistor.

4. The system of claim 1, wherein the amplifier is an operational transconductance amplifier.

5. The system of claim 1, wherein the amplifier is a differential amplifier.

6. The system of claim 1, wherein the first MOS transistor and the second MOS transistor are substantially imperfectly matched high voltage MOS transistors.

7. A circuit system comprising at least one amplifier, the system comprising:
   a first MOS transistor having a first source element, a first drain element, and a first gate element;
   a first low voltage current source having two ends, at least one of the ends connected to at least one of the MOS transistor elements;
   at least one first Zener clamp connected between the first gate element and at least one other of the first MOS transistor elements; and
   a third MOS transistor having a third source element, a third drain element, and a third gate element, wherein at least two of the third MOS transistor elements are connected to two of the ends of the first low voltage current source.

8. The system of claim 7, further comprising:
   a second MOS transistor having a second source element, a second drain element, and a second gate element, the second MOS transistor connected to the first MOS transistor;
   a second low voltage current source having two ends, the second low voltage current source connected between at least two of the second MOS transistor elements;
   at least one second Zener clamp connected between at least two of the second MOS transistor elements; and
   a fourth MOS transistor having a fourth source element, a fourth drain element, and a fourth gate element, at least two of the fourth MOS transistor elements connected to two of the ends of the second low voltage current source.

9. The system of claim 8, wherein the third MOS transistor and the fourth MOS transistor are high voltage MOS transistors thereby being operable at greater than 5 volts.

10. The system of claim 1, further comprising
    a second MOS transistor having a second source element, a second drain element, and a second gate element, wherein the first MOS transistor and the second MOS transistor are parts of a single amplifier;
    a second low voltage current source having two ends, at least one of the second low voltage current source ends connected to one of the second MOS transistor elements; and
    at least one second Zener clamp connected between at least two of the second MOS transistor elements,
    wherein the MOS transistors are rated for greater than 100 volts.

11. A method for trimming at least one amplifier in a circuit, the method comprising the steps of:
    arranging a first MOS transistor having a first source element, a first drain element, and a first gate element in communication with a first low voltage current source having two ends;
    connecting at least one first Zener clamp to at least two of the first MOS transistor elements, wherein the first Zener clamp comprises a pair of unidirectional Zener diodes in series; and
    manipulating the current source to alter a current across the first MOS transistor.

12. The method of claim 11, further comprising
    connecting a second MOS transistor, having a second source element, a second drain element, and a second gate element, to the first MOS transistor;
    connecting a second low voltage current source to the second MOS transistor; and
    connecting at least one second Zener clamp to at least two of the second MOS transistor elements.

13. The method of claim 12, further comprising the step of imperfectly matching the first MOS transistor and the second MOS transistor, wherein the first MOS transistor and the second MOS transistor are high voltage MOS transistors.

14. The method of claim 11, further comprising the step of connecting a third MOS transistor having a third source element, a third drain element, and a third gate element, to the ends of the first low voltage current source.

15. A method for trimming at least one amplifier in a circuit, the method comprising the steps of:
- arranging a first MOS transistor having a first source element, a first drain element, and a first gate element in communication with a first low voltage current source having two ends;
- connecting at least one first Zener clamp to at least two of the first MOS transistor elements;
- manipulating the current source to alter a current across the first MOS transistor;
- connecting a third MOS transistor having a third source element, a third drain element, and a third gate element, to the ends of the first low voltage current source;
- arranging a second MOS transistor, having a second source element, a second drain element, and a second gate element, in an amplifier with the first MOS transistor;
- connecting a second low voltage current source to the second MOS transistor;
- connecting at least one second Zener clamp to at least two of the second MOS transistor elements; and
- connecting at least two elements of a fourth MOS transistor having a fourth source element, a fourth drain element, and a fourth gate element, to the ends of the second low voltage current source.

16. The method of claim 15, further comprising the step of connecting the third MOS transistor and the fourth MOS transistor with a third current source.

17. The method of claim 11, further comprising:
- arranging a second MOS transistor, having a second source element, a second drain element, and a second gate element, in an amplifier with the first MOS transistor;
- connecting a second low voltage current source to the second MOS transistor; and
- connecting at least one second Zener clamp to at least two of the second MOS transistor elements.

18. A circuit system comprising at least one amplifier, the system comprising:
- a first MOS transistor having a first source element, a first drain element, and a first gate element;
- a first low voltage current source having two ends, the ends connected to the first source element and the first gate element;
- a first electrical device in parallel with the first low voltage current source, wherein the electrical device limits a voltage across the first low voltage current source;
- a second MOS transistor having a second source element, a second drain element, and a second gate element, wherein the first MOS transistor and the second MOS transistor are parts of the amplifier;
- a second low voltage current source having two ends, the ends connected to the second source element and the second gate element; and
- a second electrical device in parallel with the second low voltage current source, wherein the electrical device limits a voltage across the second low voltage current source.

19. The system of claim 18, wherein the first electrical device and the second electrical device are Zener clamps.

* * * * *